(12) United States Patent
Fernandes et al.

(10) Patent No.: US 11,605,587 B2
(45) Date of Patent: Mar. 14, 2023

(54) METHODS FOR ETCHING METAL INTERCONNECT LAYERS

(71) Applicant: TEXAS INSTRUMENTS INCORPORATED, Dallas, TX (US)

(72) Inventors: Poornika Fernandes, Murphy, TX (US); Bhaskar Srinivasan, Allen, TX (US); Scott William Jessen, Allen, TX (US); Guruvayurappan S. Mathur, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 795 days.

(21) Appl. No.: 16/383,176

(22) Filed: Apr. 12, 2019

(65) Prior Publication Data

US 2020/0328149 A1 Oct. 15, 2020

(51) Int. Cl.
*H01L 23/522* (2006.01)
*H01L 49/02* (2006.01)
*H01L 21/02* (2006.01)
*H01L 21/3213* (2006.01)
*H01L 21/311* (2006.01)

(52) U.S. Cl.
CPC ...... *H01L 23/5223* (2013.01); *H01L 21/0214* (2013.01); *H01L 21/31111* (2013.01); *H01L 21/32133* (2013.01); *H01L 28/60* (2013.01)

(58) Field of Classification Search
CPC ................................................ H01L 23/522
See application file for complete search history.

(56) References Cited

U.S. PATENT DOCUMENTS

| 2006/0205140 A1* | 9/2006 | Wofford | H01L 28/40 438/239 |
| 2015/0115404 A1* | 4/2015 | Hsueh | H01L 28/60 438/3 |

* cited by examiner

*Primary Examiner* — Marvin Payen
(74) *Attorney, Agent, or Firm* — Jacqueline J. Garner; Frank D. Cimino

(57) ABSTRACT

In some examples, a method comprises: obtaining a substrate having at a metal interconnect layer deposited over the substrate; forming a first dielectric layer on the metal interconnect layer; forming a second dielectric layer on the first dielectric layer; forming a capacitor metal layer on the second dielectric layer; patterning and etching the capacitor metal layer and the second dielectric layer to the first dielectric layer to leave a portion of the capacitor metal layer and the second dielectric layer on the first dielectric layer; forming an anti-reflective coating to cover the portion of the capacitor metal layer and the second dielectric layer, and to cover the metal interconnect layer; and patterning the metal interconnect layer to form a first metal layer and a second metal layer.

16 Claims, 11 Drawing Sheets

METHODS FOR ETCHING METAL INTERCONNECT LAYERS

SUMMARY

In accordance with at least one example of the disclosure, a method comprises: obtaining a substrate having at a metal interconnect layer deposited over the substrate; forming a first dielectric layer on the metal interconnect layer; forming a second dielectric layer on the first dielectric layer; forming a capacitor metal layer on the second dielectric layer; patterning and etching the capacitor metal layer and the second dielectric layer to the first dielectric layer to leave a portion of the capacitor metal layer and the second dielectric layer on the first dielectric layer; forming an anti-reflective coating to cover the portion of the capacitor metal layer and the second dielectric layer, and to cover the metal interconnect layer; and patterning the metal interconnect layer to form a first metal layer and a second metal layer.

In accordance with at least one example of the disclosure, a method comprises forming a silicon nitride layer on a metal layer; forming a titanium nitride layer on the silicon nitride layer; patterning and etching the titanium nitride layer and the silicon nitride layer to form a capacitor dielectric, leaving a portion of the silicon nitride layer on the metal layer; and forming an anti-reflective coating to cover exposed portions of the titanium nitride layer and the silicon nitride layer.

In accordance with at least one example of the disclosure, an integrated circuit, comprises: a substrate; a first metal layer and a second metal layer positioned on a same horizontal level above the substrate; a first dielectric disposed on the first metal layer and a first anti-reflective coating disposed on the first dielectric; a second dielectric disposed on the second metal layer and a third dielectric disposed on the second dielectric; a capacitor metal layer disposed on the third dielectric layer; and a second anti-reflective coating disposed on the capacitor metal layer and the second dielectric.

BRIEF DESCRIPTION OF THE DRAWINGS

For a detailed description of various examples, reference will now be made to the accompanying drawings in which.

DETAILED DESCRIPTION

Figure 1A:
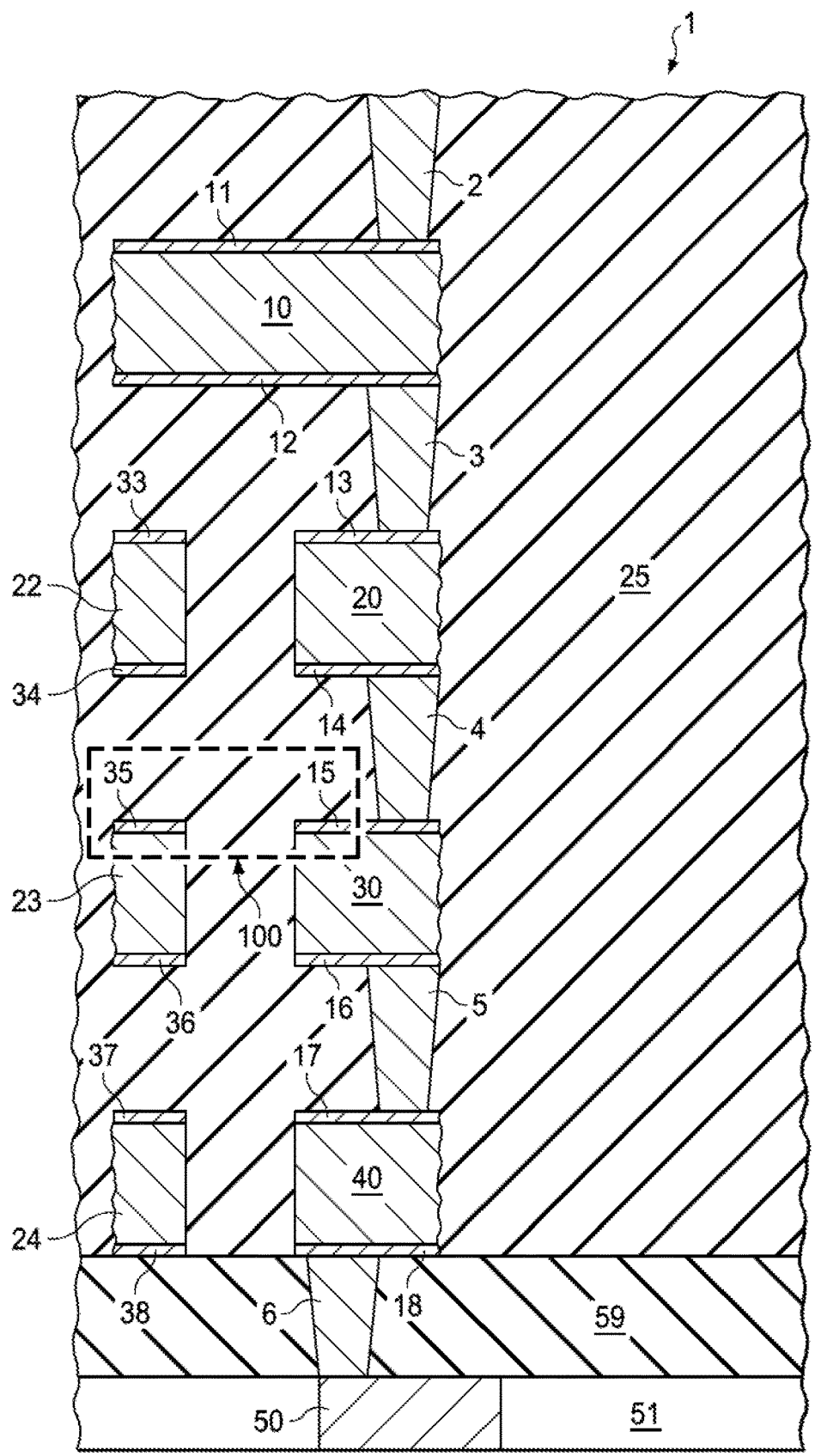
FIG. 1(a) is a cross-sectional diagram of an illustrative integrated circuit fabricated on a semiconductor substrate, in accordance with various examples.

Integrated circuits (ICs) are typically fabricated in large batches on a single semiconductor wafer of high quality (e.g., electronic grade) silicon (or other semiconductor material, e.g., gallium arsenide) using microfabrication processing techniques. ICs include microelectronic elements, such as transistors, and these microelectronic elements are coupled to each other using metal interconnect layers. These metal interconnect layers (or sometimes referred to herein as metal layers) provide signal pathways between the microelectronic elements. In some cases, the metal layers are present at different horizontal levels that are vertically spaced relative to each other. The horizontal levels are present above the semiconductor wafer and connect through via structures, which are perpendicular trenches filled with a suitable metal.

In some cases, integrated circuits include capacitors, which may be fabricated on one of the metal interconnect layers, where the metal interconnect layer acts as a conducting plate of the capacitor. A dielectric material, along with a metal layer, may be deposited on the aforementioned metal interconnect layer to form the capacitor. In some cases, the dielectric material used to realize the capacitor also performs the function of an anti-reflecting coating for the underlying metal interconnect layer. The anti-reflecting coating enables patterning the metal interconnect layers. In other words, because metals reflect light, the anti-reflecting coating prevents the reflection of the light used during photolithography, and thus, enables patterning the metal interconnect layers.

ICs operating at high voltages (e.g., 48V or more) employ thick dielectrics to meet reliability specifications. Pattering the underlying metal interconnect layer in the presence of a thick dielectric that is also acting as the anti-reflecting coating is challenging. Patterning of the underlying metal interconnect layer is particularly challenging for ICs formed at technology nodes below, for example, 130 nm. Thus, new methods of fabrication are needed that mitigate the above mentioned issue.

Accordingly, methods and devices are described where dielectrics do not perform the function of an anti-reflecting coating, and during fabrication, a separate layer that performs the function of the anti-reflecting coating is deposited. Because a separate layer is used as the anti-reflecting coating, the properties of the anti-reflecting coating and the dielectric layer can be tuned independently to provide desired low reflection and high dielectric constant properties, respectively.

In some examples, a capacitor is formed on a metal interconnect layer and includes a dielectric comprising a silicon nitride layer and a silicon dioxide layer, where the silicon dioxide layer is on the metal interconnect layer and the silicon nitride layer is on the silicon dioxide layer.

In some examples, a capacitor includes one type of dielectric comprising a silicon nitride layer. In such examples, the silicon nitride layer is on the metal interconnect layer. The metal interconnect layer serves as a first capacitor plate and a second metal layer, for instance, titanium nitride layer that is deposited on the dielectric serves as a second capacitor plate. After etching the second metal layer and the dielectric, an anti-reflecting coating including, for instance, silicon oxynitride is deposited to pattern the underlying metal interconnect layer for the subsequent manufacturing processes.

In examples where the capacitor dielectric comprises a silicon nitride layer on a silicon dioxide layer, the silicon oxynitride of the anti-reflective coating is formed on that part of the silicon dioxide layer not covered by the silicon nitride layer (after etching), so that the portion of the silicon dioxide layer covered by the silicon oxynitride can be considered as part of the anti-reflective coating. In examples where the capacitor dielectric comprises a silicon nitride layer on the metal interconnect layer, the silicon oxynitride of the anti-reflecting coating is formed on a portion of the silicon nitride layer remaining after etching the silicon nitride layer to form the capacitor dielectric, so that the portion of the silicon nitride layer covered by the silicon oxynitride can be considered as part of the anti-reflecting coating.

FIG. 1(a) is a cross-sectional diagram of a portion of an illustrative integrated circuit 1 fabricated on a semiconductor substrate 51. For ease of illustration, the semiconductor substrate 51 is shown as a block. From a fabricated IC standpoint, the substrate 51 may further comprise a plurality of isolation features (not expressly shown in FIG. 1), such as shallow trench isolation (STI) features or local oxidation of silicon (LOCOS) features. The isolation features define and isolate the various microelectronic elements (not expressly shown in FIG. 1). Examples of the various microelectronic elements that may be formed in the substrate 51 include transistors (e.g., metal oxide semiconductor field effect transistors (MOSFETs), complementary metal oxide semiconductor (CMOS) transistors, bipolar junction transistors (BJT), high voltage transistors, high frequency transistors, p-channel and/or n-channel field effect transistors (PFETs/NFETs), etc.), resistors, diodes, and other suitable elements. One such microelectronic element is marked with numeral 50 in FIG. 1(a). Various processes are performed to form the various microelectronic elements including deposition, etching, implantation, photolithography, annealing, and other suitable processes. The microelectronic elements fabricated in the semiconductor substrate 51 is covered with pre-metal dielectric layer 59 before metal interconnect layers are deposited. The microelectronic elements are interconnected using one or more of the metal interconnect layers 10, 20, 30, 40, 22, 23, and 24. An inter-level dielectric (ILD) 25 electrically isolates the metal interconnect layers 10, 20, 30, 40, 22, 23, and 24 from each other. The metal interconnect layers 10, 20, 30, 40, 22, 23, and 24 may sometimes herein be referred to as metal layers 10, 20, 30, 40, 22, 23, and 24.

In some examples, the metal layers 10, 20, 30, 40, 22, 23, and 24 have layers 11, 13, 15, 17, 33, 35, and 37 disposed on their respective top sides. In some examples, the metal layers 10, 20, 30, 40, 22, 23, and 24 have layers 12, 14, 16, 18, 34, 36, and 38 disposed on their respective bottom sides. In some examples, layers 12, 14, 16, 18, 34, 36, and 38 include titanium nitride or titanium/titanium nitride bilayer, which prevents the oxidation of the metal interconnect layer that will be deposited in the subsequent steps. In other examples, at least one of the layers 11, 13, 15, 17, 33, 35, and 37 forms a capacitor with their respective underlying metal interconnect layers. Examples of such capacitors are described ahead in FIG. 1(b) and FIG. 6.

The metal layers 24 and 40 are positioned on the same horizontal level, and this horizontal level is referred herein as MET 1 level. Before the metal layers 24, 40 were separate units, a single metal layer (not shown) was deposited on the pre-metal dielectric layer 59 and then the single metal layer was patterned to form the metal layers 24 and 40. Some of the metal layers present on MET 1 level couple to the microelectronic elements fabricated in the pre-metal dielectric layer 59 through a via structure. For example, via structure 6 connects the block 50 to the metal layer 40. The metal layers 23 and 30 are disposed on a second level of the metal layers (or "MET 2 level"). From a fabrication perspective, a single metal layer was first deposited at the MET 2 level and then patterned to form the metal layers 23 and 30. Some of the metal layers present on MET 2 level may couple to the block 50 by a connection formed by a combination of one or more via structures and metal layers. For example, the metal layer 30 couples to the block 50 through via structure 5 that couples to the metal layer 40, which further couples to the block 50 through the via structure 6.

The metal layers 22 and 20 are disposed in the ILD 25 and are present on the same horizontal level, and this horizontal level can be referred as a third level of the metal layers (or "MET 3 level"). From a fabrication perspective, a single metal layer was deposited at the MET 3 level and then patterned to form the metal layers 22 and 20. Some of the metal layers present on MET 3 level may couple to the block 50 by a connection formed by a combination of one or more via structures and metal layers. For example, the metal layer 20 couples to the block 50 through a via structure 4 that couples to the metal layer 30, which further couples to the block 50 through the via structure 5, the metal layer 40, and the via structure 6. As further described in detail below, the methods described in this disclosure refers to the patterning of the metal layers in the MET 1, 2, and 3 levels.

The metal layer 10 is disposed in the ILD 25 and is present on horizontal level that is a fourth level of the metal layers (or "MET 4 level"). The metal layer 10 may couple to the block 50 by a connection formed by a combination of one or more via structures and metal layers. For example, the metal layer 10 couples to the block 50 through a via structure 3 that couples to the metal layer 20, which further couples to the block 50 through the via structure 4, the metal layer 30, the via structure 5, the metal layer 40, and the via structure 6. The metal layer 10 coupled to a top metal layer (not shown) through via structure 2. The top metal layer further couples to other layers that may couple to a power source (not shown) and act as a voltage source for the microelectronic elements (represented here as the block 50). The example depicted in FIG. 1(a) shows four levels of metal layers, e.g., MET 1, 2, 3, and 4 levels. However, in other examples, the number of levels may vary. The metal layers 22, 23, and 24 appear to be floating. However, in practical implementation, the metal layers 23, 24 may couple with one of the other metal interconnect layers through via structures that are not expressly shown in FIG. 1(a).

Figure 1B:
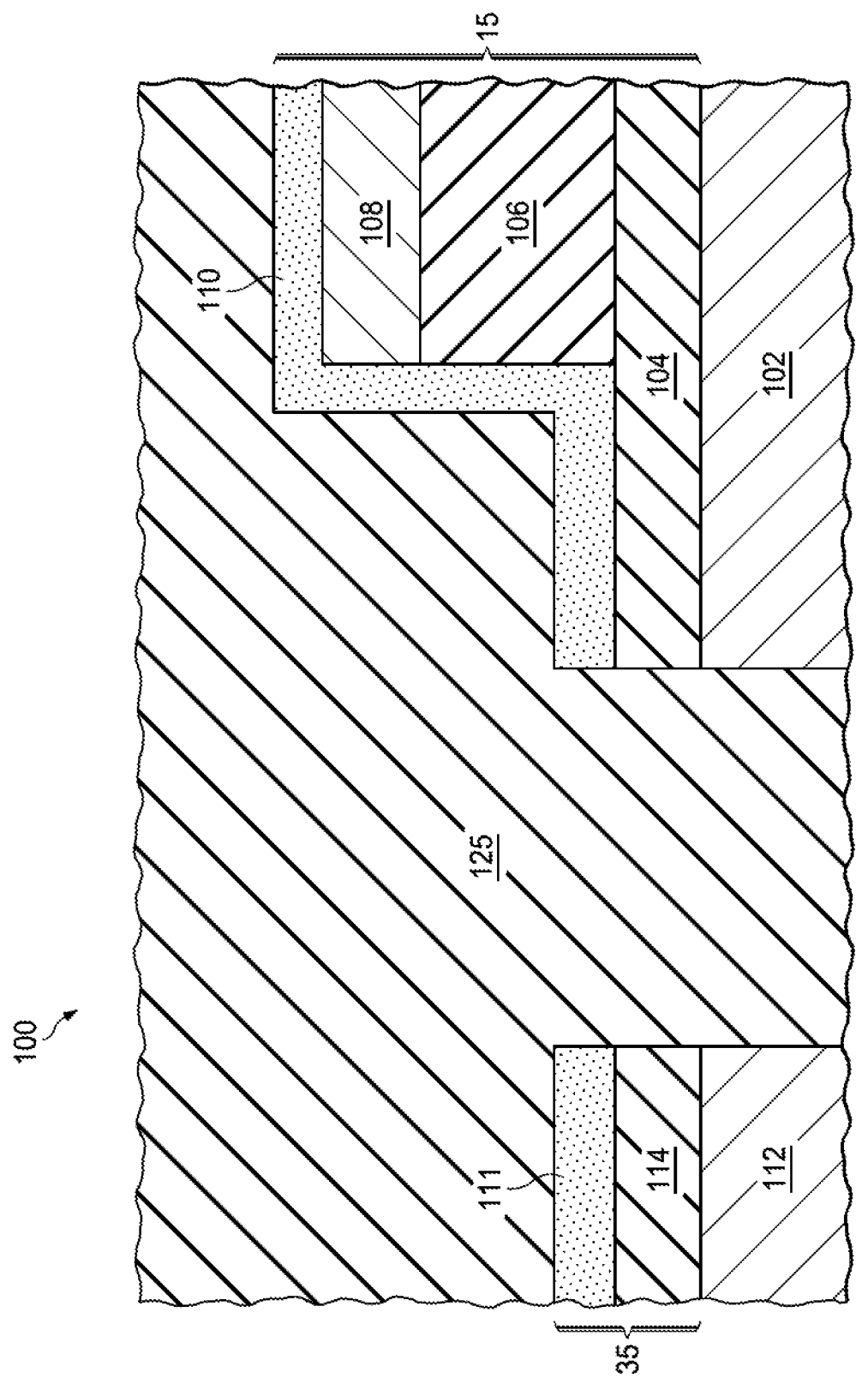
FIG. 1(b) depicts a portion of the integrated circuit shown in FIG. 1(a), in accordance with various examples.

Refer now to FIG. 1(b), which depicts an area 100 marked in FIG. 1(a). The area 100 shows a portion of the layer 15 (FIG. 1(a)) as layers 104, 106, 108, and 110 in FIG. 1(b). The area 100 also shows a portion of the layer 35 (FIG. 1(a)) as layers 114, 111 in FIG. 1(b). The area 100 also shows portions of metal layers 23 and 30 as metal layers 112, 102, respectively. The area 100 further depicts a portion of the ILD 25 of FIG. 1(a) as ILD 125 in FIG. 1(b).

As noted above, the layer 15 of FIG. 1(a) forms capacitor with its underlying metal layer 30. FIG. 1(b) depicts the layers present in the layer 15 that realizes such a capacitor. For example, layers 108 and 102 form the top and bottom plates, respectively of the capacitor, and the layers 104 and 106 act as the dielectrics of the capacitor. In one example, the layer 104 includes silicon dioxide and the layer 106 includes silicon nitride. In other examples, the layers 104, 106 may include other dielectrics such as, aluminum oxide, hafnium oxide, and zirconium oxide. In one example, the layer 108 includes titanium nitride and the metal layer 102 includes an alloy of aluminum and copper. In some examples, the layer 108 is also referred to as capacitor metal layer and includes tantalum/tantalum nitride, tungsten/tungsten nitride. In some examples, the layers 104 and 106 may be formed from the same dielectric material, and an example of such an embodiment is described in FIG. 6 ahead.

In examples where the layer 106 includes silicon nitride, the layer 106 has a thickness in a range of 1000 angstroms to 1600 angstroms and has an index of refraction in a range of 2.3 to 2.9. In examples where the layer 108 includes titanium nitride, layer 108 has a thickness in a range of 1000 angstroms to 1600 angstroms. In some examples, the layer 104 protects the metal layer 102 during etching of the layer 106.

The thicknesses and various other parameters of the layer 106 and layer 108 can be selected to achieve the desired capacitance and breakdown voltage of the resulting capacitor. As an example, for the layer 106, including silicon nitride and having a thickness in the range 1200 angstroms to 1400 angstroms and an index of refraction in the range of 2.3 to 2.9, and for the layer 108, including titanium nitride and having a thickness in a range of 1000 to 1600 angstroms, the resulting capacitor has a breakdown voltage of about 120V, which is well suited to automotive applications having a 48V electrical system.

As further described below in detail, after patterning and etching the layers 106 and 108, an anti-reflective coating is deposited on the exposed portions. As explained below in FIG. 4, the anti-reflective coating helps patterning metal interconnect layer to form the metal layers 102 and 112. The anti-reflective coating also facilitates fabricating other structures, such as a via structure to the metal layer 102 with other metal layers and circuit components. The anti-reflective coating helps achieve small critical dimension (CD) in photolithography steps, and in some examples, can be stripped away at a later point in the fabrication process flow. In the example of FIG. 1(*b*), the anti-reflective coatings 110, 111 comprise silicon oxynitride. In some examples, the silicon oxynitride in the anti-reflective coatings 110, 111 has an index of refraction in a range of 1.7 to 2.1, and a thickness in a range of 200 angstroms to 400 angstroms. In some examples, the silicon oxynitride has an index of refraction of about 1.9. Such examples can have a capacitance density of about 0.4 femto-Farad per square micron.

Figure 4:
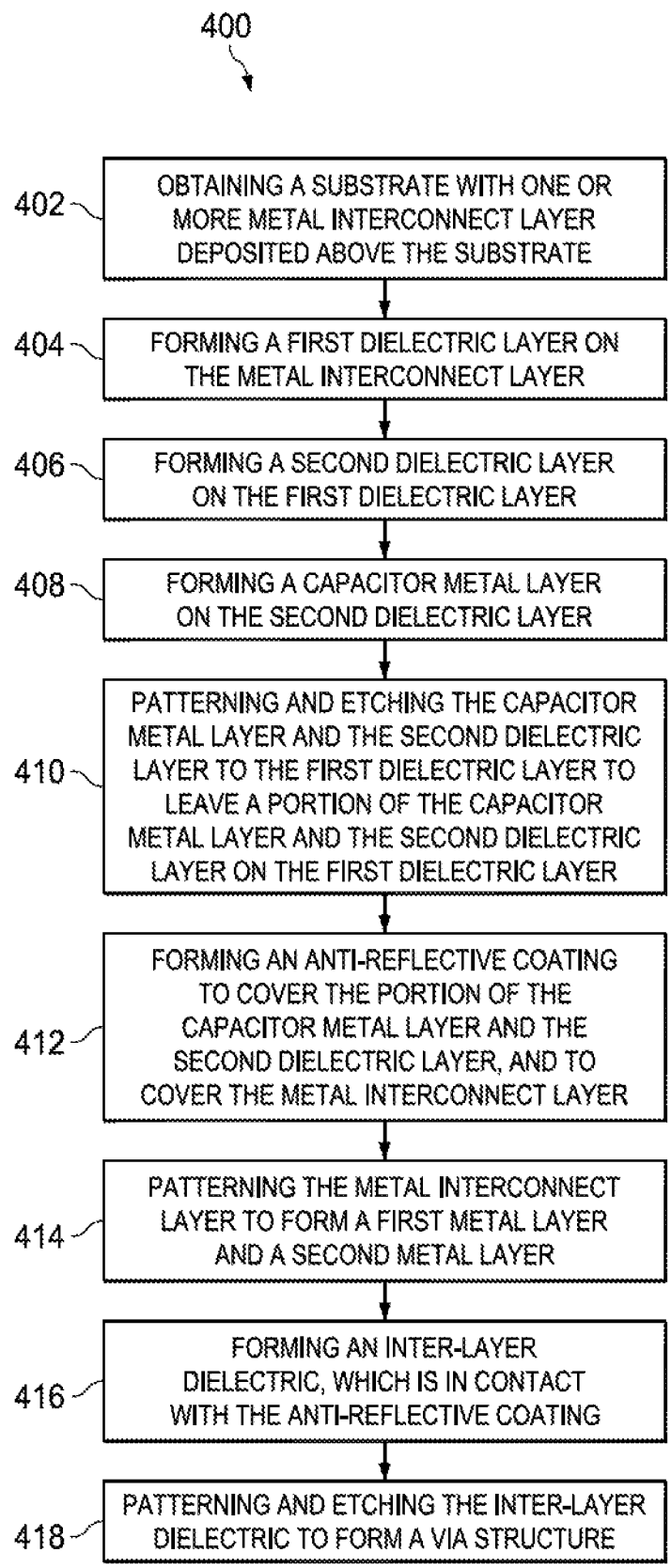
FIG. 4 shows a method, in accordance with various examples.
Figure 5A:
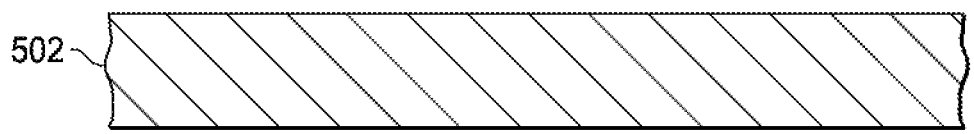
FIG. 5(a) through FIG. 5(l) show a method in accordance with various examples.
Figure 5B:
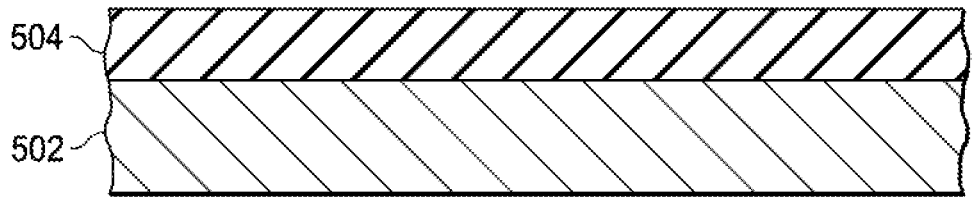
Figure 5C:
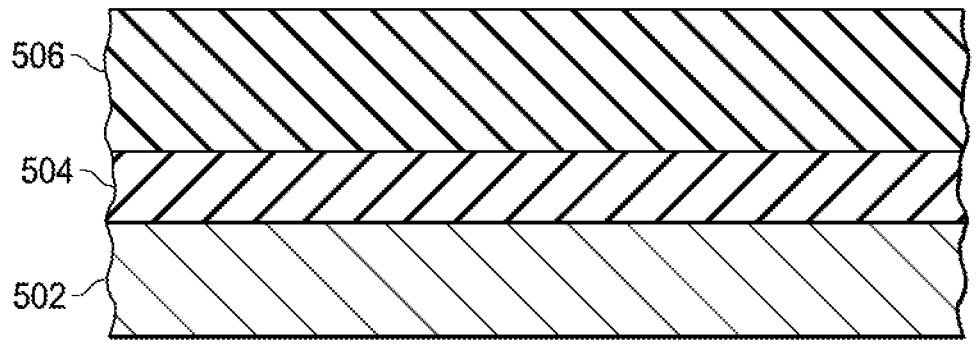
Figure 5D:
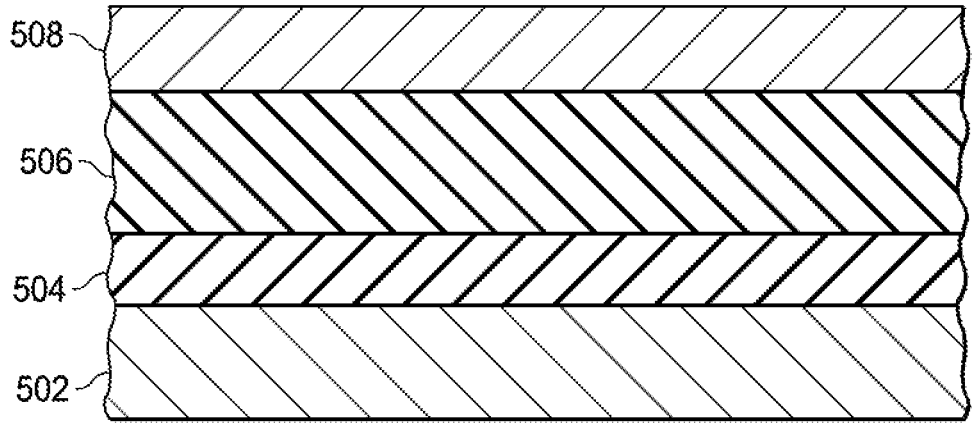
Figure 5E:
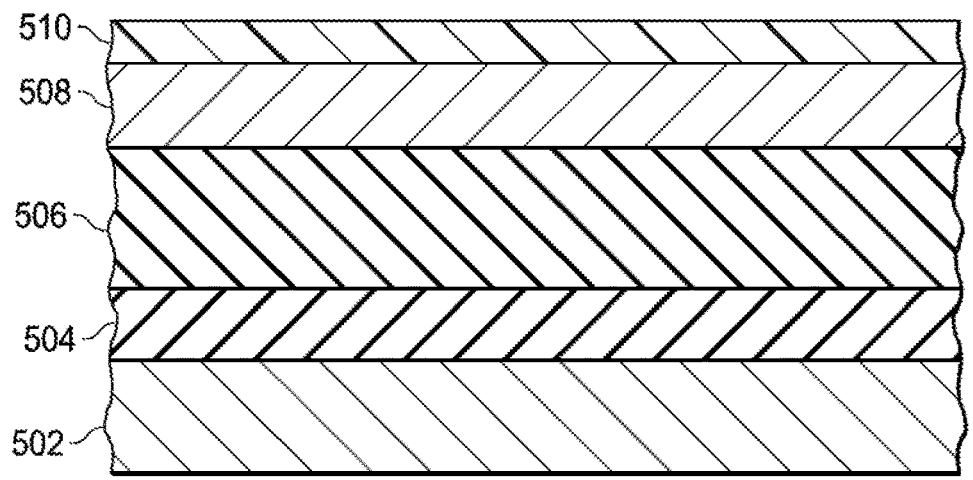
Figure 5F:
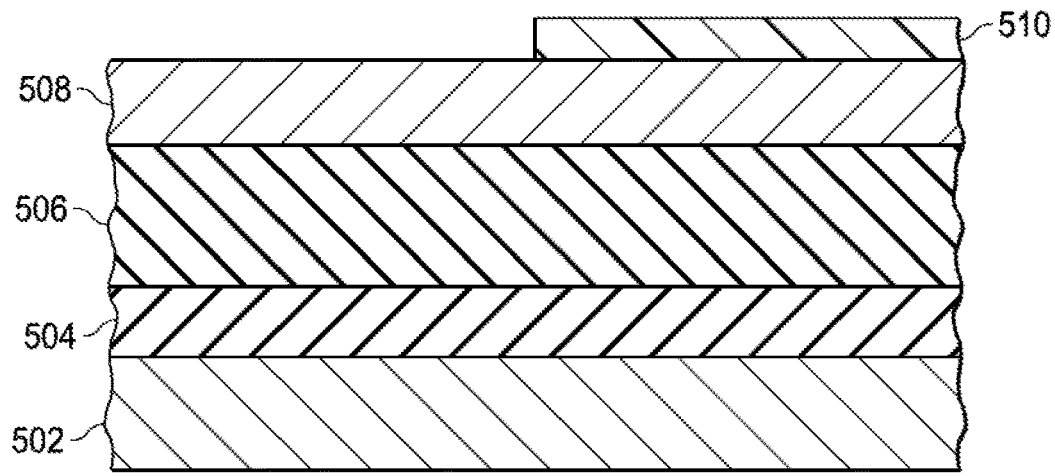
Figure 5G:
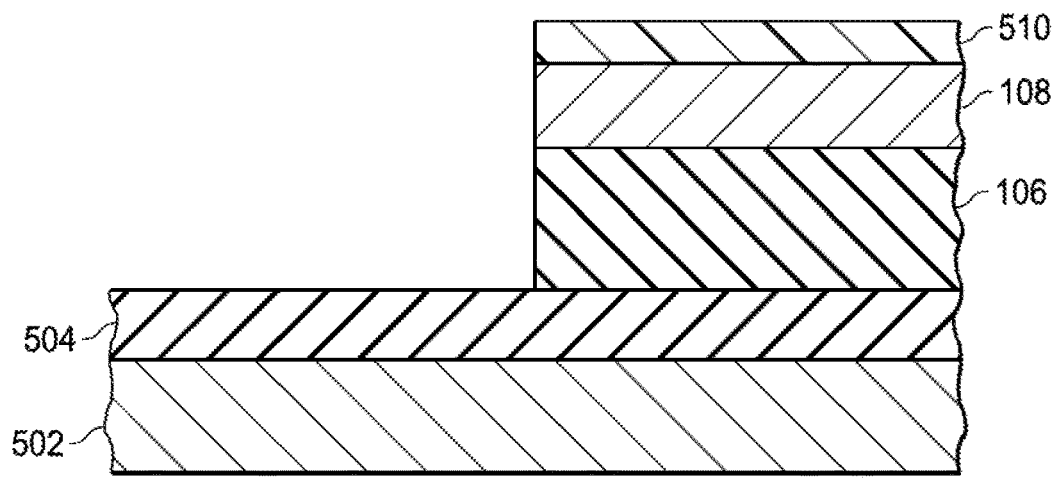
Figure 5H:
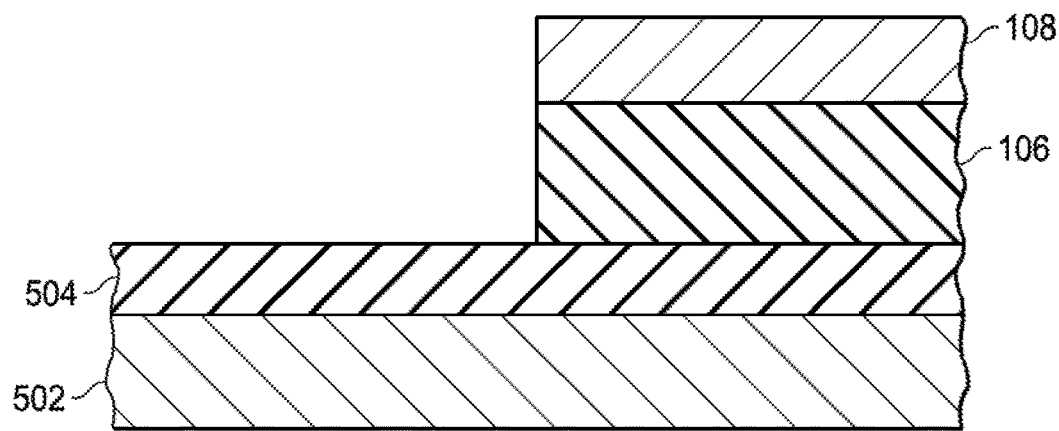
Figure 5I:
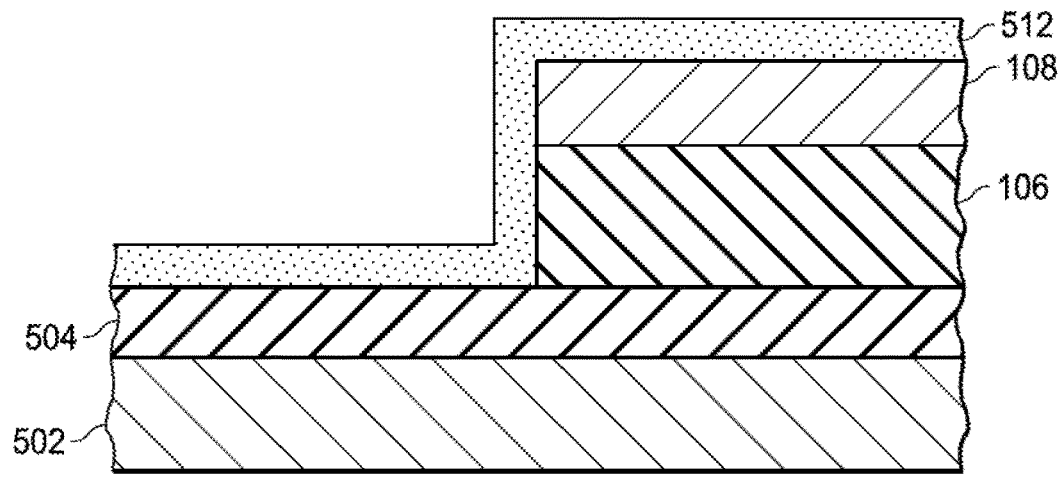
Figure 5J:
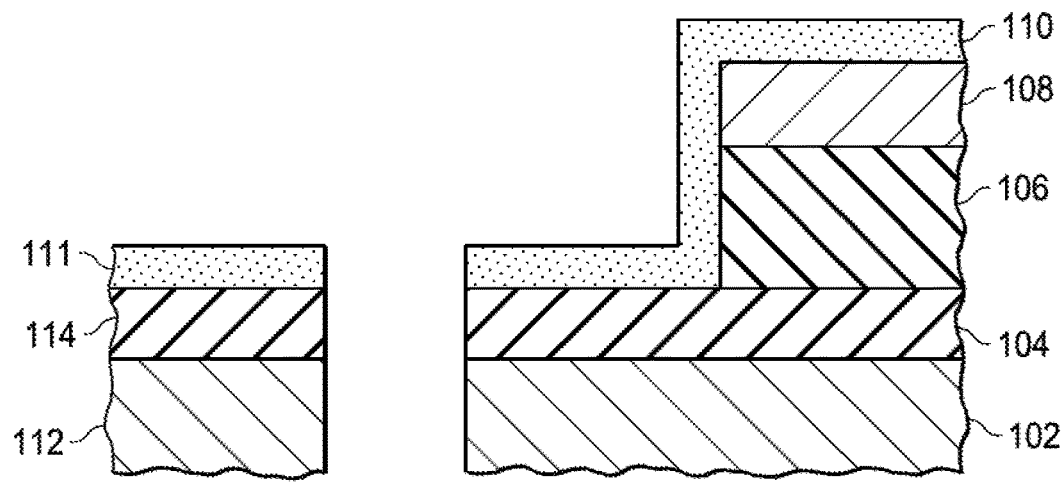
Figure 5K:
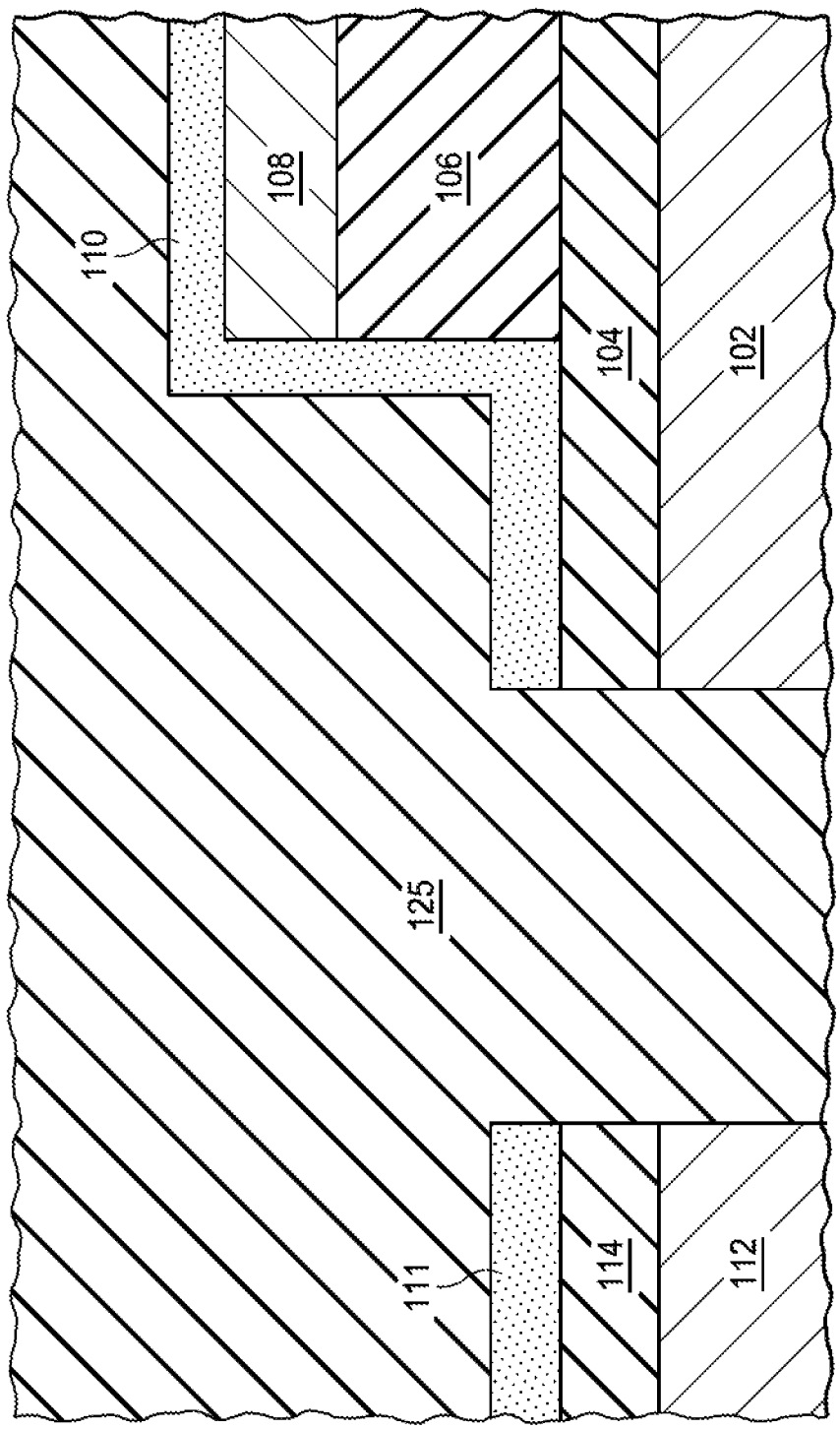
Figure 5L:
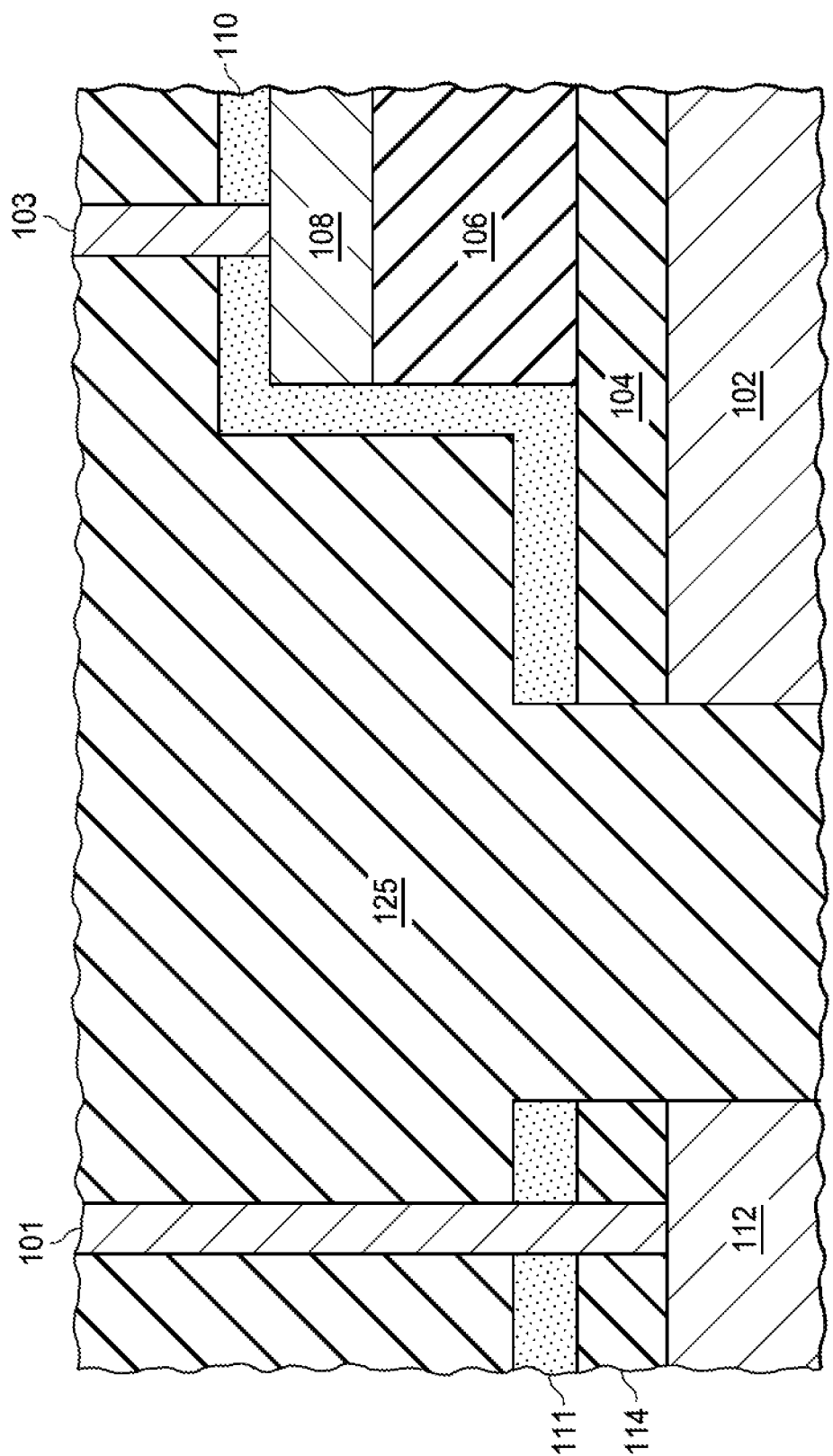

Referring now to FIG. 4, an illustrative method 400 is shown. The method 400 describes the fabrication steps that may be performed to form the capacitor described in FIG. 1(*b*). The method 400 also describes the use of anti-reflective coating, which facilitates patterning the underlying metal interconnect layer. In one example, patterning forms patterned metal layers, such as the metal layers 102 and 112 of FIG. 1(*b*). The method 400 is described in tandem with FIGS. 5(*a*)-5(*i*).

The method 400 begins with step 402 that includes obtaining a substrate with one or more metal interconnect layers deposited over the substrate. Now refer to FIG. 5(*a*) that depicts a metal interconnect layer 502. For illustration's sake, the metal interconnect layer 502 can be thought to be present in the MET 2 level, and in such an example, the metal interconnect layer 502 is deposited on an inter-dielectric layer (not expressly shown in FIG. 5(*a*)), similar to the ILD 25. For simplicity sake, FIGS. 5(*a*)-5(*l*) depict the fabrication steps performed on the metal interconnect layer 502, and the different layers that may be present below the metal interconnect layer 502 are not explicitly shown. The metal interconnect layer 502 may be formed using sputtering or chemical vapor deposition (CVD) process. In some examples, the metal interconnect layer 502 may include an alloy of aluminum and copper.

The method 400 then moves to step 404 (FIG. 5(*b*)) that includes forming, using CVD technique, a first dielectric layer 504 on the metal interconnect layer 502. In one example, the first dielectric layer 504 includes silicon dioxide. In other examples, the first dielectric layer 504 includes silicon nitride. Method 400 further proceeds to step 406 (FIG. 5(*c*)) that includes forming, using CVD technique, a second dielectric layer 506 on the first dielectric layer 504. In one example, the second dielectric layer 506 may include silicon nitride. Method 400 describes the use of two dielectric layers (layers 504, 506). However, in some examples, a single dielectric layer may be used. In such examples, the single dielectric layer may comprise silicon nitride. Such an example is described in FIG. 6 ahead.

Method 400 then proceeds to step 408 (FIG. 5(*d*)) that includes forming, using sputtering or CVD technique, a capacitor metal layer 508 on the second dielectric layer 506. In one example, the capacitor metal layer 508 includes titanium nitride. Method 400 further proceeds to step 410 that includes patterning and etching the capacitor metal layer 508 and second dielectric layer 506 to the first dielectric layer 504 to leave a portion of the capacitor metal layer 508 and the second dielectric layer 506 on the first dielectric layer 504. The patterning and etching described in the step 410 may include first depositing photoresist 510 (FIG. 5(*e*)) on the capacitor metal layer 508. The photoresist 510 is illuminated in a photolithography process so that a portion of the photoresist 510 is exposed (FIG. 5(*f*)) and then stripped away (FIG. 5(*g*)). The exposed portions of the capacitor metal layer 508 and the second dielectric layer 506 not covered by the photoresist 510 are etched, where the etching stops at the first dielectric layer 504. The second dielectric layer 506 and the capacitor metal layer 508, after being etched, form layers 106 and 108, respectively (FIG. 5(*g*)). The photoresist 510 is shown to be stripped away in FIG. 5(*h*).

Method 400 then proceeds to step 412 (FIG. 5(*i*)) that includes forming—using sputtering, CVD, or related technique—an anti-reflective coating 512 to cover exposed portions of the capacitor metal layer 508, first dielectric layer 504, and the second dielectric layer 506 (vertical portion of the layer 106). In one example, the anti-reflective coating 512 comprises silicon oxynitride. This anti-reflective coating 512 facilitates patterning the metal interconnect layer 502 and connecting the metal interconnect layer 502 with other circuit components. The composition and various parameters associated with the anti-reflective coating 512 can be selected independently of the various parameters associated with the layers making up the resulting capacitor, namely the first dielectric layer 504, the second dielectric layer 506, and the capacitor metal layer 508. The properties of the resulting capacitor and the anti-reflective coating 512 can be independently optimized.

In some examples, the method 400 further comprises step 414 that includes patterning the metal interconnect layer 502 (FIG. 5(*j*)) to form metal layers 102, 112. As noted above, the presence of the anti-reflective coating 512 enables patterning the metal interconnect layer 502 by not reflecting the light used during lithography. Before patterning, a dry film or a photoresist film is deposited on the surface of anti-reflective coating 512 using a suitable coating process, which is followed by curing, descum, and the like, which is further followed by lithography technology and/or etching processes, such as a dry etch and/or a wet etch process, to expose the surface of the metal interconnect layer 502 that should to be etched. The anti-reflective layer 512 forms anti-reflective layers 110, 111 after the metal interconnect layer 502 is etched. Method 400 then proceeds to step 416 that includes forming—using CVD process—an interlayer dielectric 125 (FIG. 5(*k*)) that, in one example, is in contact with the anti-reflective layers 110 and 111. In other examples, the anti-reflective layers 110, 111 may be etched away before the inter-layer dielectric 125 is deposited.

In some examples, the metal layers 102, 112, and layer 108 may connect to other metal interconnect layers and, thus electrically connect to other electrical components in the integrated circuit. As noted above, this electrical connection is made using via structures, which may be formed by patterning and etching the inter-layer dielectric 125. In effect, in some examples, the method 400 may further proceed to step 418 that includes patterning and etching the inter-layer dielectric 125 to form one or more via structures (FIG. 5(*l*)). The example shown in FIG. 5(*l*) shows via structures 101 and 103 that are in contact with the metal layer 112 and capacitor metal 108, respectively. As noted above in FIG. 1(*b*), the layers 104 and 106 of FIG. 1(*b*) may be formed from the same dielectric material, and an example of such an embodiment is described in FIG. 6.

Figure 6:
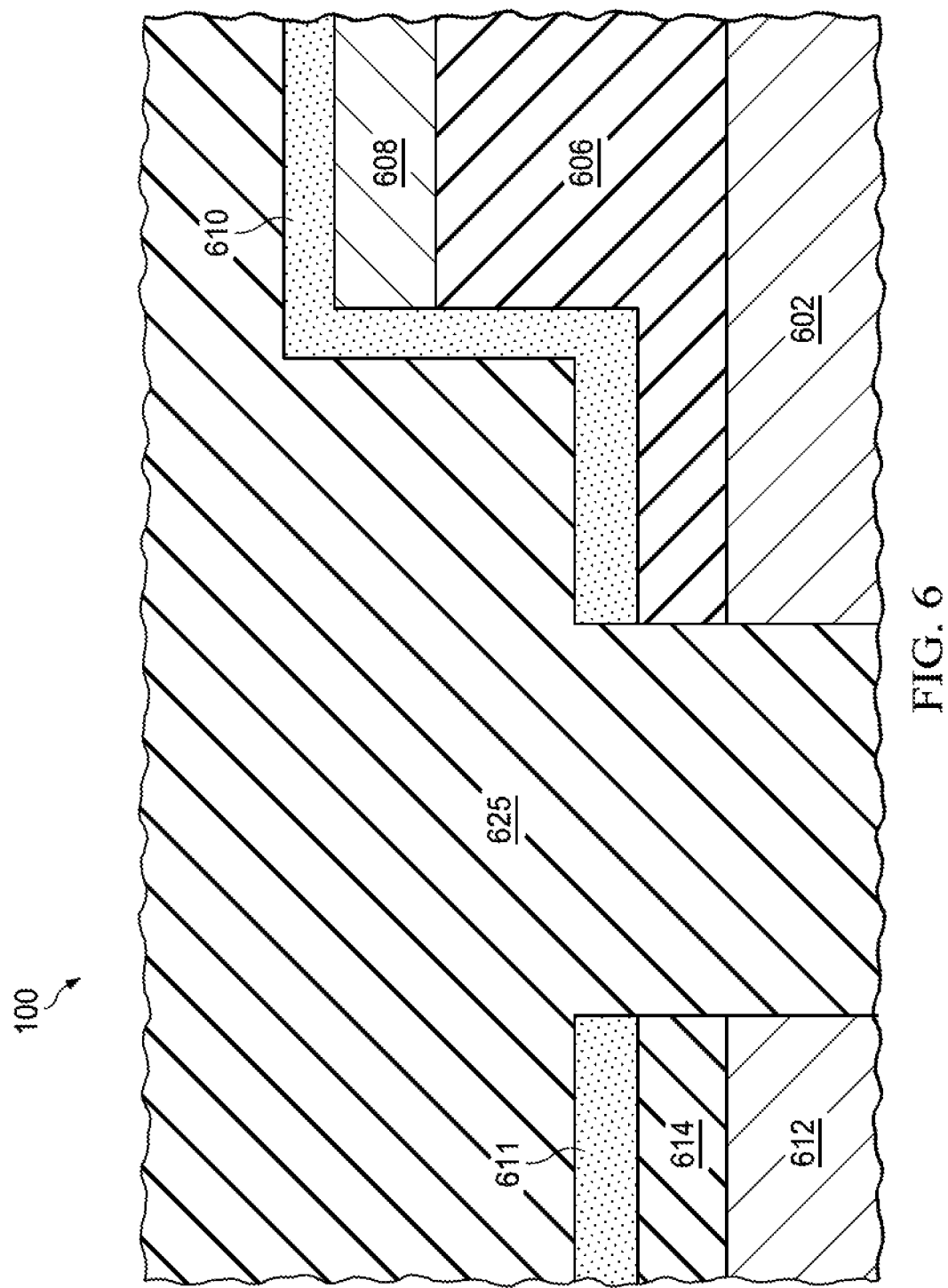
FIG. 6 depicts a portion of the integrated circuit shown in FIG. 1(a), in accordance with various examples.

Referring now to FIG. 6, which depicts the area 100 marked in FIG. 1(*a*) and includes a capacitor that is formed by the combination of the layers 602, 606, and 608. The layer 602 is the metal layer that is a first plate of the resulting capacitor; the layer 608 is a second plate of the resulting capacitor; and layer 606 is the dielectric layer and includes silicon nitride. During manufacture of the portion 100 of FIG. 6, the layer 606 and the layer 608 are patterned and etched so as to form the resulting capacitor; after the etch, a portion of the layer 606 covers the layer 602. In comparing the example of FIG. 6 to that of FIG. 1, the layer 106 of FIG. 1(*b*) has been etched down to the layer 104, where the layer 104 protects the metal layer 102, but in the example of FIG. 6, some the layer 606, which may comprise silicon nitride, remains on the layer 602 after etching. The layers 608, 606, and 602 are similar to the layers 108, 106, and 102, respectively, of FIG. 1(*b*), and the description of the layers 108, 106, and 102 applies to the layers 608, 606, and 602, respectively.

Anti-reflective coatings 610, 611 are formed over the exposed portions of the layer 608 and the layer 606, and as in the example of FIG. 1(*b*) and the fabrication process above, the anti-reflective coatings 610, 611 are useful when fabricating other circuit components (not shown) to connect to one or more layers of FIG. 6, such as the layer 602. The anti-reflective coatings 610, 611 help reduce the critical dimension in photolithography steps, and can be stripped away at a later point in the process flow. During the process flow, an inter-layer dielectric 625 is formed in contact with one or more of the layers of the portion 100 of FIG. 6. The anti-reflective coatings 610, 611 are similar to the anti-reflective coatings 110, 111, respectively, and the description of the anti-reflective coatings 110, 111 applies to the anti-reflective coatings 610, 611, respectively.

Figure 2:
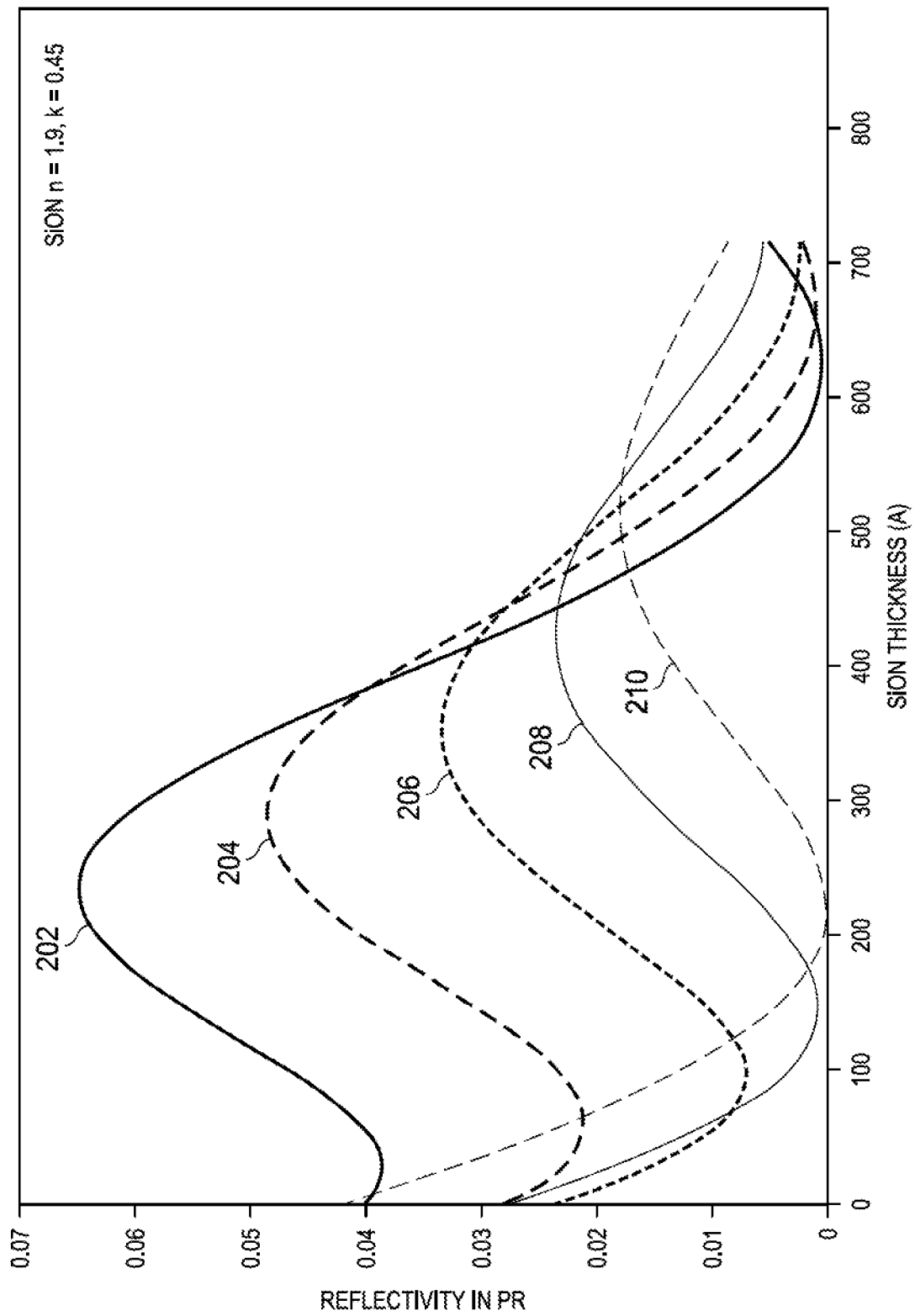
FIG. 2 shows reflectivity of an anti-reflective coating in accordance with various examples.

Referring now to FIG. 2, an illustrative graph depicting the reflectivity of an anti-reflective coating in accordance with various examples is shown. In the examples of FIG. 2, a photoresist (not expressly shown) is deposited on a silicon oxynitride (or an anti-reflective coating), where the antireflective coating is formed by first depositing silicon nitride, followed by etching down the silicon nitride and then re-depositing silicon oxynitride with various thicknesses. The layer of silicon oxynitride over silicon nitride in the examples of FIG. 2 corresponds to the example of FIG. 6, where the silicon oxynitride and silicon nitride can be viewed as the anti-reflective coating 610.

For the examples of FIG. 2, the silicon oxynitride has an index of refraction of 1.9 with a k dielectric value (imaginary part of the wavevector) of 0.45. The y-axis of FIG. 2 shows the reflectivity values at the photoresist, and the x-axis shows the thickness values of the silicon oxynitride.

Each curve in FIG. 2 is for a particular value of thickness of silicon nitride under the silicon oxynitride, where: for curve 202, the silicon nitride is 300 angstroms thick; for curve 204, the silicon nitride is 250 angstroms thick; for curve 206, the silicon nitride is 200 angstroms thick; for curve 208, the silicon nitride is 150 angstroms thick; and for curve 210, the silicon nitride is 100 angstroms thick. As a particular example illustrated in FIG. 2, the minimum reflectivity is achieved with 150 angstrom of silicon nitride and the silicon oxynitride. FIG. 2 illustrates that reflectivity can depend upon the various parameters of the anti-reflective coating 610, and is not meant to imply any particular set of best values.

Figure 3:
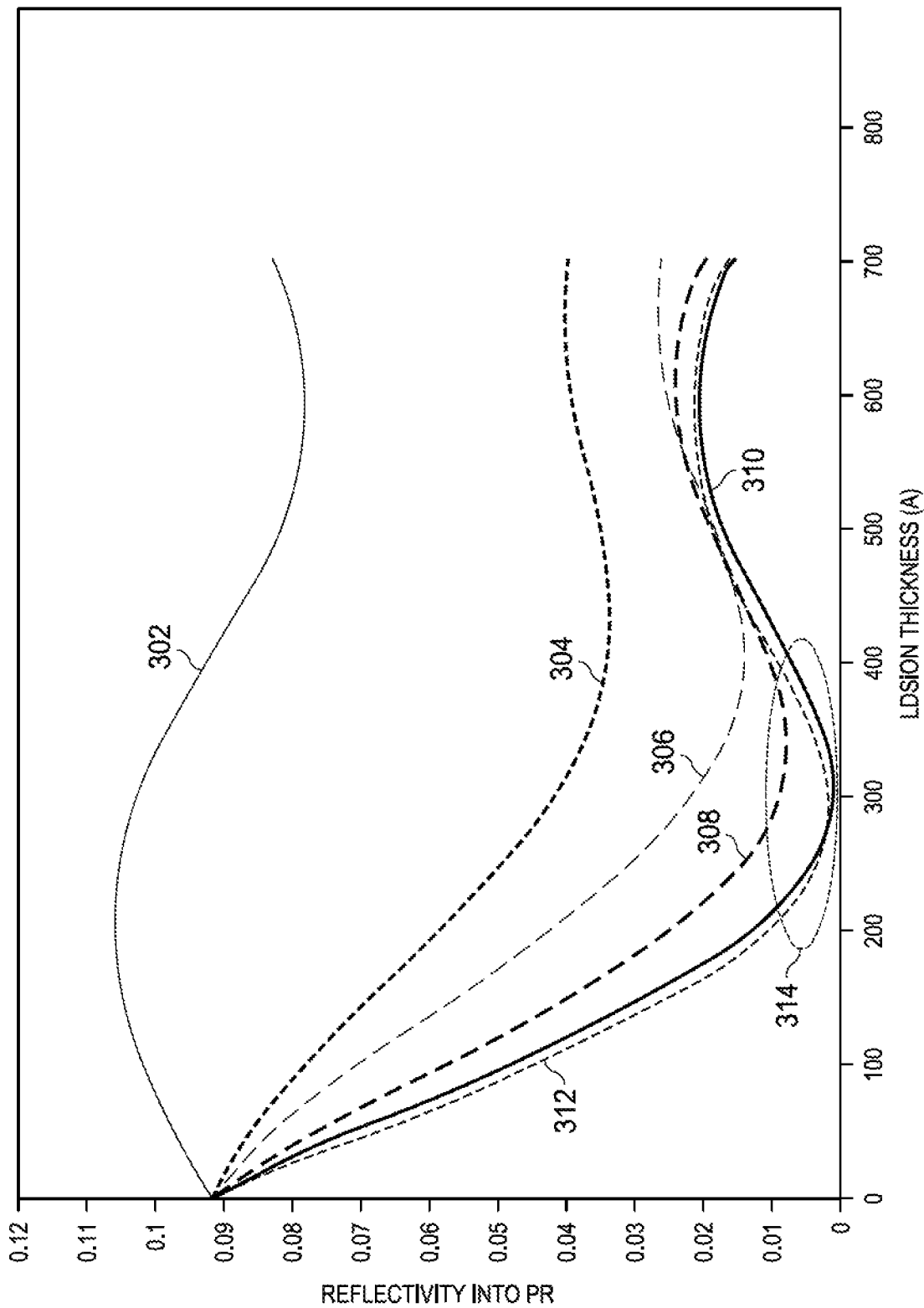
FIG. 3 shows reflectivity of an anti-reflective coating in accordance with various examples.

FIG. 3 shows reflectivity of an anti-reflective coating in accordance with various examples. In the examples of FIG. 3, a photoresist film is deposited on silicon oxynitride, which is deposited on silicon dioxide. The silicon dioxide is over a metal layer. This example corresponds to that of FIG. 1(*b*) where the silicon dioxide layer 104 can be viewed as part of the anti-reflective layer 110. In the examples illustrated in FIG. 3, the anti-reflective coating is formed by first depositing low-deposition silicon oxynitride with an index of refraction of 1.68, followed by etching down the deposited silicon oxynitride and then re-depositing silicon oxynitride of various thicknesses and index of refraction. The y-axis of FIG. 3 shows the reflectivity values at the photoresist, and the x-axis shows the thickness values of the silicon oxynitride (LDSiON), each curve representing various values for the index of refraction and the k dielectric.

For curve 302, the silicon oxynitride has an index of refraction of 1.68 with a k dielectric value of 0.007. For curve 304, the silicon oxynitride has an index of refraction of 1.79 with a k dielectric value of 0.13. For curve 306, the silicon oxynitride has an index of refraction of 1.79 with a k dielectric value of 0.224. For curve 308, the silicon oxynitride has an index of refraction of 1.87 with a k dielectric value of 0.3. For curve 310, the silicon oxynitride has an index of refraction of 1.9 with a k dielectric value of 0.45. For curve 312, the silicon oxynitride has an index of refraction of 1.92 with a k dielectric value of 0.53.

The oval curve 314 in FIG. 3 is drawn to indicate values for the index of refraction, thickness, and k dielectric of the silicon oxynitride for which the reflectivity is minimized (for the particular parameters shown in FIG. 3). For example, a relatively low reflectivity is obtained for an index of refraction in the range of 1.87 to 1.92 for a thickness range of about 250 angstroms to 350 angstroms. FIG. 3 illustrates how reflectivity depends upon the various parameters of the anti-reflective coating 110, and is not meant to imply any particular set of best values.

In the foregoing discussion and in the claims, the terms "including" and "comprising" are used in an open-ended fashion, and thus may be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A method comprising:
    obtaining a substrate having at a metal interconnect layer deposited above the substrate;
    forming a first dielectric layer on the metal interconnect layer;
    forming a second dielectric layer on the first dielectric layer;
    forming a capacitor metal layer on the second dielectric layer;
    patterning and etching the capacitor metal layer and the second dielectric layer, the patterning and etching extending into the first dielectric layer to leave a portion of the capacitor metal layer and the second dielectric layer on the first dielectric layer;
    forming an anti-reflective coating to cover the portion of the capacitor metal layer and the second dielectric layer, and to cover the metal interconnect layer; and
    patterning the metal interconnect layer to form a first metal layer and a second metal layer, the first metal layer forming a plate of a capacitor.

2. The method of claim 1, wherein the second dielectric layer has a thickness in a range of 1000 angstroms to 1600 angstroms.

3. The method of claim 1, wherein the second dielectric layer comprises silicon nitride and has an index of refraction in a range of 2.3 to 2.9.

4. The method of claim 1 further comprising:
    forming an inter-layer dielectric, which is in contact with the anti-reflective coating; and
    patterning and etching the inter-layer dielectric to form a via structure.

5. The method of claim 1, wherein the capacitor metal layer has a thickness in a range of 1000 angstroms to 1400 angstroms.

6. The method of claim 1, wherein the capacitor metal layer comprises titanium nitride.

7. The method of claim 1, wherein the first dielectric layer has a thickness in a range of 100 to 200 angstroms.

8. The method of claim 1, wherein the anti-reflective coating comprises silicon oxynitride.

9. The method of claim 8, wherein the anti-reflective coating has an index of refraction in a range of 1.7 to 2.1.

10. The method of claim 8, wherein the anti-reflective coating has a thickness in a range of 100 angstroms to 400 angstroms.

11. A method comprising:
    obtaining a substrate with a metal layer deposited above the substrate;
    forming a silicon nitride layer on the metal layer;
    forming a titanium nitride layer on the silicon nitride layer;
    patterning and etching the titanium nitride layer and the silicon nitride layer to form a capacitor dielectric, leaving a portion of the silicon nitride layer on the metal layer;
    forming an anti-reflective coating to cover exposed portions of the titanium nitride layer and the silicon nitride layer, exposed portions including sidewalls of the titanium nitride layer and the silicon nitride layer; and
    patterning the metal layer.

12. The method of claim 11, wherein the silicon nitride layer has a thickness in a range of 1000 angstroms to 1600 angstroms.

13. The method of claim 12, wherein the silicon nitride layer has an index of refraction in a range of 2.3 to 2.9.

14. The method of claim 12, wherein the titanium nitride layer has a thickness in a range of 1000 angstroms to 1400 angstroms.

15. The method of claim 11, wherein forming the anti-reflective coating comprises forming a silicon oxynitride.

16. The method of claim 15, wherein the silicon oxynitride has an index of refraction in a range of 1.7 to 2.1.

* * * * *